(12) United States Patent  
Nishiyama et al.

(10) Patent No.: US 8,390,015 B2
(45) Date of Patent: Mar. 5, 2013

(54) ORGANIC EL ELEMENT, ORGANIC EL DISPLAY APPARATUS, AND MANUFACTURING METHOD OF ORGANIC EL ELEMENT

(75) Inventors: Seiji Nishiyama, Osaka (JP); Takashi Ohta, Kyoto (JP)

(73) Assignee: Panasonic Corporation, Osaka (JP)

( * ) Notice: Subject to any disclaimer, the term of this patent is extended or adjusted under 35 U.S.C. 154(b) by 23 days.

(21) Appl. No.: 13/052,540

(22) Filed: Mar. 21, 2011

(65) Prior Publication Data

US 2011/0165517 A1     Jul. 7, 2011

Related U.S. Application Data

(63) Continuation of application No. PCT/JP2009/006813, filed on Dec. 11, 2009.

(30) Foreign Application Priority Data

Dec. 26, 2008  (JP) .................................. 2008-334204

(51) Int. Cl.
*H01L 51/50* (2006.01)

(52) U.S. Cl. ..................... 257/98; 257/40; 257/E51.018; 438/22; 438/99; 438/952; 313/504; 313/507; 359/586

(58) Field of Classification Search ................... 257/40, 257/59, 72, 98, E51.018; 438/22, 99, 952; 313/504, 506, 507; 359/586
See application file for complete search history.

(56) References Cited

U.S. PATENT DOCUMENTS

| | | | |
|---|---|---|---|
| 5,472,827 A | 12/1995 | Ogawa et al. | |
| 5,472,829 A | 12/1995 | Ogawa | |
| 5,591,566 A | 1/1997 | Ogawa | |
| 5,641,607 A | 6/1997 | Ogawa et al. | |
| 5,648,202 A | 7/1997 | Ogawa et al. | |
| 5,670,297 A | 9/1997 | Ogawa et al. | |
| 5,677,111 A | 10/1997 | Ogawa | |
| 5,698,352 A | 12/1997 | Ogawa et al. | |
| 6,791,261 B1 | 9/2004 | Shimoda et al. | |
| 7,605,535 B2 | 10/2009 | Kobayashi | |
| 7,671,369 B2 | 3/2010 | Yamazaki et al. | |

(Continued)

FOREIGN PATENT DOCUMENTS

| | | |
|---|---|---|
| JP | 6-196400 | 7/1994 |
| JP | 9-171952 | 6/1997 |

(Continued)

OTHER PUBLICATIONS

U.S. Appl. No. 13/088,654 to Takayuki Takeuchi et al., filed Apr. 18, 2011.

(Continued)

*Primary Examiner* — Kenneth Parker
*Assistant Examiner* — Yu Chen
(74) *Attorney, Agent, or Firm* — Greenblum & Bernstein, P.L.C.

(57) ABSTRACT

An organic EL element includes a substrate and a light refractive layer, a first transparent electrode layer, an insulation layer, a hole transport layer, and a photosensitive resin layer stacked above the substrate. A luminous function layer is above the hole transport layer in a recess defined by the photosensitive resin layer. A second transparent electrode layer is above the luminous function layer. The light reflective layer, the first transparent electrode layer, the insulation layer, and the hole transport layer are formed above the substrate in a region isolated by the photosensitive resin layer. The photosensitive resin layer comprises a material that absorbs incident light of a predetermined wavelength. The first transparent electrode layer, the insulation layer, the hole transport layer, and the photosensitive resin layer each have a reflectance value that is between a local minimum value and a neighborhood value of the local minimum value.

16 Claims, 11 Drawing Sheets

U.S. PATENT DOCUMENTS

| | | |
|---|---|---|
| 7,764,014 B2 | 7/2010 | Yoshida et al. |
| 2003/0189210 A1 | 10/2003 | Yamazaki et al. |
| 2006/0108919 A1 | 5/2006 | Kobayashi |
| 2009/0284135 A1 | 11/2009 | Yoshida et al. |
| 2011/0042703 A1 | 2/2011 | Okumoto et al. |
| 2011/0049522 A1 | 3/2011 | Yamazaki et al. |

FOREIGN PATENT DOCUMENTS

| | | |
|---|---|---|
| JP | 2003-528421 | 9/2003 |
| JP | 2003-302917 | 10/2003 |
| JP | 2004-127551 | 4/2004 |
| JP | 2006-173089 | 6/2006 |
| JP | 2006-216466 | 8/2006 |
| JP | 2007-273243 | 10/2007 |
| JP | 2009-187957 | 8/2009 |
| WO | 2008/149499 | 12/2008 |

OTHER PUBLICATIONS

International Search Report and Written Opinion in PCT/JP2009/006813, mailing date of Feb. 2, 2010.

(A)

(B)

(A)

(B)

ORGANIC EL ELEMENT, ORGANIC EL DISPLAY APPARATUS, AND MANUFACTURING METHOD OF ORGANIC EL ELEMENT

CROSS REFERENCE TO RELATED APPLICATION

This is a continuation application of PCT Application No. PCT/JP2009/006813 filed Dec. 11, 2009, designating the United States of America, the disclosure of which, including the specification, drawings and claims, is incorporated herein by reference in its entirety.

The disclosure of Japanese Patent Application No. 2008-334204, filed on Dec. 26, 2008, including the specification, drawings, and claims is incorporated herein by reference in its entirety.

BACKGROUND OF THE INVENTION

1. Field of the Invention

The present invention relates to organic electroluminescence (EL) elements, organic EL display apparatuses using the organic EL elements, and a manufacturing method of the organic EL elements.

2. Description of the Related Art

Light-emitting devices using organic EL elements are expected to be applied as next-generation displays which replace cathode ray tubes (CRTs), liquid crystal displays (LCDs), and plasma display panels (PDPs) as thin and light-weight light-emitting devices of a self-luminous type.

Organic EL elements are classified by its manufacturing process into a coating type and a deposition type. In fabricating organic EL elements of the coating type, an inkjet process is currently predominant. In applying a luminescent material in this inkjet process, the luminescent material needs to be printed on only a specified area of pixels, but with only discharge accuracy in the inkjet process, it is difficult to achieve coating with required accuracy for such limitation of the coating area.

An existing solution to the above difficulty is to form bank-like shapes called banks on pixel electrodes, and a luminescent material is discharged and applied to recesses in the middle of the banks (Japanese Unexamined Patent Publication Application No. 2004-127551).

In most cases, a photosensitive resin is used in the process of forming banks. Specifically, in many cases, the banks are formed by exposing, via a mask of a predetermined pattern, a substrate coated with positive or negative photosensitive resin, to light from a light source which emits i line, g line, or h line, or emits all of these lines, followed by development and other processes. Thus, a method of forming banks using a light source which emits light of short wavelengths is predominant.

In many cases, at the time of providing an actual substrate with a layer of photosensitive resin which will be banks, there is already a structure in which a transparent electrode, a reflecting electrode, a hole transport layer (hereinafter referred to as HTL), or the like is stacked on the substrate. Now, a problem is described which occurs in an organic electroluminescence element of so-called a top emission type (hereinafter referred to as organic EL element) that uses a metal having relatively high reflectance for the reflecting electrode.

In some cases of an organic EL element of the top emission type, banks are formed on a substrate on which, for example, a 100 nm-thick molybdenum chrome electrode (hereinafter referred to as MoCr electrode) is formed as a reflecting electrode and a 40 nm-thick indium tin oxide electrode (hereinafter referred to as ITO electrode) is further stacked.

In such cases, a so-called cavity effect between the bank layer and the set of MoCr electrode and the ITO electrode results in dependence of reflectance on wavelengths. The dependence of reflectance on wavelengths is based on a so-called optical resonance effect indicating that when an optical path length between the respective layers is equal to the integral multiple of a certain wavelength, the light of that wavelength is reflected on the MoCr electrode and emitted with high intensity.

For example, the optical path length changes according to an amount of changes in thickness of the ITO electrode, leading to drastic changes in intensity of the reflection. Especially, the reflection intensity of light for exposure having a short wavelength in the ultraviolet light range, etc., changes with high sensitivity depending on changes in the thickness of the ITO electrode.

The photosensitive resin for the banks is influenced by the light reflected from the base at the time of exposure. For example, in a positive photosensitive resin, as the intensity of the light reflected from the base changes, acid generation by the exposure changes, with the result that the shapes of the banks after the development become different. Furthermore, also in a negative photosensitive resin, as the intensity of the light reflected from the base changes, a degree of polymerization, a degree of cross-linkage, and the like change, with the result that the shapes of the banks after the development become different.

In particular, in an organic EL display apparatus including a plurality of organic EL elements arranged in a plane, in-plane variations in thickness of the ITO electrode make the intensity of the light reflected from the base different in the plane. This deteriorates in-plane uniformity of shape (including a thickness and a taper angle) of the formed banks, resulting in deteriorated in-plane shape uniformity of a luminescent material layer that is formed in the inkjet process.

As above, because the shape of the formed banks is influenced by the thickness of the ITO electrode, not only it is difficult to fabricate an organic EL element having a desired bank shape, but also there is an unfavorable problem of in-plane unevenness (so-called luminance variations) in luminescence characteristics of the organic EL display apparatus.

The present invention has been devised in view of the above conventional problems, and an object of the present invention is to provide an organic EL element capable of reducing errors in shape of formed banks and an organic EL display apparatus which uses such organic EL elements and has excellent in-plane uniformity of luminescence characteristics.

SUMMARY OF THE INVENTION

In order to the above problem, an organic electro-luminescence (EL) element according to an aspect of the present invention includes: a light refractive layer, a transparent electrode layer, a hole transport layer, an insulation layer, and a photosensitive resin layer that are stacked on a substrate; a luminous function layer isolated by the photosensitive resin layer; and a second transparent electrode layer provided above the luminous function layer, wherein the light reflective layer, the transparent electrode layer, the hole transport layer, and the insulation layer are formed on the substrate in a region isolated by the photosensitive resin layer, the photosensitive resin layer is made of a material which absorbs incident light of a particular wavelength λ in a process of forming a bank by exposing the photosensitive resin layer to the incident light, the bank isolating the luminous function layer, a thickness of each of the transparent electrode layer, the hole transport layer, the insulation layer, and the photosensitive resin layer that are included in an optical multilayered film is set such that reflectance has a value between a local minimum and a neighborhood value of the local minimum, the reflectance being a ratio of reflection of the incident light which is reflected on the light reflective layer and directed toward the photosensitive resin layer, to the incident light directed from a side of the photosensitive resin layer toward the light reflective layer, and the particular wavelength λ satisfies the following:

$$d1 = 1/n1 \times 4.0a \times \lambda/4$$

$$d2 = 1/n2 \times 1.0a \times \lambda/4$$

$$d3 = 1/n3 \times 7.0a \times \lambda/4$$

$$d4 = 1/n4 \times 5.0a \times \lambda/4$$

where d1 is the thickness of the transparent electrode layer, d2 is the thickness of the hole transport layer, d3 is the thickness of the insulation layer, d4 is the thickness of the photosensitive resin layer, n1 is a refractive index of the transparent electrode layer, n2 is a refractive index of the hole transport layer, n3 is a refractive index of the insulation layer, n4 is a refractive index of the photosensitive resin layer, and a is a predetermined constant.

In the present aspect, the thickness of each layer of the above optical multilayered film is controlled so that the reflectance of the incident light of the particular wavelength λ directed toward the light reflective layer has a value between a local minimum and a neighborhood value of the local minimum. Being between the local minimum and the neighborhood value of the local minimum, the reflectance has small variations even when the thickness of each layer of the optical multilayered film varies.

With this, the light emitted from an exposure device directly to the photosensitive resin layer and a total amount of the light reflected from the light reflective layer and reaching the photosensitive resin layer can be made almost constant.

As a result, it is possible to reduce errors in shape of the banks of the organic EL elements formed from the photosensitive resin layer, and the thicknesses of the luminous function layers formed in regions isolated by the banks in an ink coating process such as an inkjet process can therefore be made the same. Consequently, it is possible to provide an organic EL display apparatus with excellent in-plane uniformity of luminescence characteristics.

Furthermore, what is used to control the reflectance of the incident light to be between the local minimum and the neighborhood value of the local minimum is the above optical multilayered film itself included in the organic EL element. This means that according to the present aspect, no other members than the above optical multilayered film included in the organic EL element need to be used to control the reflectance of the incident light to be between the local minimum and the neighborhood value of the local minimum.

Thus, the thickness of each layer of the above optical multilayered film included in the organic EL element is controlled to set the reflectance of the incident light to be between the local minimum and the neighborhood value of the local minimum, with the result that errors in shape of formed banks of the organic EL elements can be reduced without adding unnecessary members for the resultant organic EL elements and without additional processes for forming such unnecessary members. That is, it is possible to provide an organic EL display apparatus with excellent in-plane uniformity of luminescence characteristics with a simple structure and in a simple manufacturing process.

According to the organic EL element in the present invention, on the basis of an optical interference phenomenon, the variations in reflectance with the variation in thickness of each layer of the above optical multilayered film are controlled with respect to the light of a particular wavelength (g line, h line, or i line), so that errors in shape of formed banks of the organic EL elements can be reduced without adding unnecessary members for the resultant organic EL elements and without additional processes for forming such unnecessary members, resulting in an organic EL display apparatus with excellent in-plane uniformity of luminescence characteristics.

BRIEF DESCRIPTION OF THE DRAWINGS

These and other objects, advantages and features of the invention will become apparent from the following description thereof taken in conjunction with the accompanying drawings that illustrate a specific embodiment of the invention. In the Drawings.

DESCRIPTION OF THE PREFERRED EMBODIMENT(S)

Figure 1:
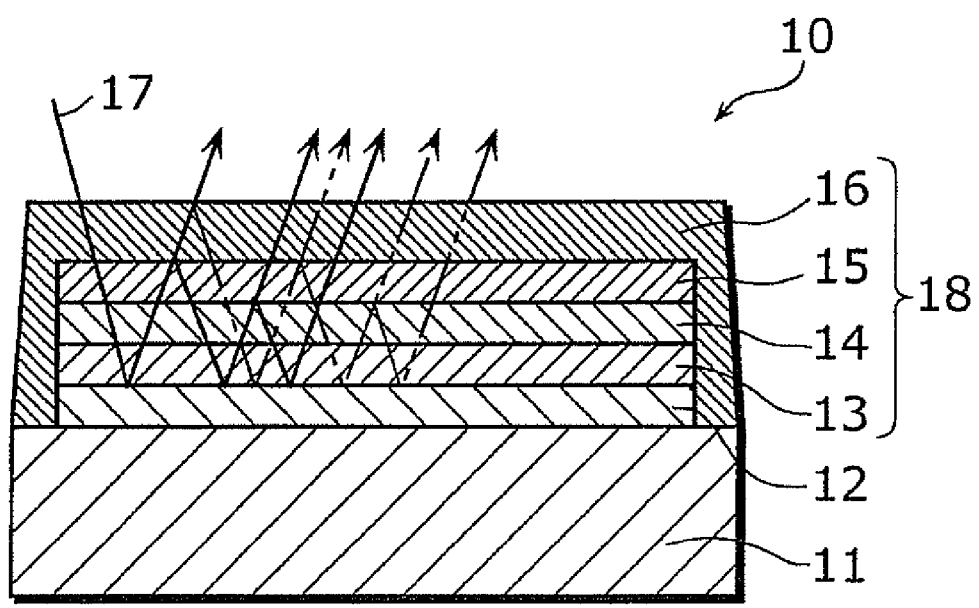
FIG. 1 is a cross-section diagram showing one example of a structure of the organic EL element according to an embodiment of the present invention, in which banks have not yet been formed.

An organic electro-luminescence (EL) element according to an aspect of the present invention includes: a light refractive layer, a transparent electrode layer, a hole transport layer, an insulation layer, and a photosensitive resin layer that are stacked on a substrate; a luminous function layer isolated by the photosensitive resin layer; and a second transparent electrode layer provided above the luminous function layer, wherein the light reflective layer, the transparent electrode layer, the hole transport layer, and the insulation layer are formed on the substrate in a region isolated by the photosensitive resin layer, the photosensitive resin layer is made of a material which absorbs incident light of a particular wavelength λ in a process of forming a bank by exposing the photosensitive resin layer to the incident light, the bank isolating the luminous function layer, a thickness of each of the transparent electrode layer, the hole transport layer, the insulation layer, and the photosensitive resin layer that are included in an optical multilayered film is set such that reflectance has a value between a local minimum and a neighborhood value of the local minimum, the reflectance being a ratio of reflection of the incident light which is reflected on the light reflective layer and directed toward the photosensitive resin layer, to the incident light directed from a side of the photosensitive resin layer toward the light reflective layer, and the particular wavelength λ satisfies the following:

$$d1 = 1/n1 \times 4.0a \times \lambda/4$$

$$d2 = 1/n2 \times 1.0a \times \lambda/4$$

$$d3 = 1/n3 \times 7.0a \times \lambda/4$$

$$d4 = 1/n4 \times 5.0a \times \lambda/4$$

where d1 is the thickness of the transparent electrode layer, d2 is the thickness of the hole transport layer, d3 is the thickness of the insulation layer, d4 is the thickness of the photosensitive resin layer, n1 is a refractive index of the transparent electrode layer, n2 is a refractive index of the hole transport layer, n3 is a refractive index of the insulation layer, n4 is a refractive index of the photosensitive resin layer, and a is a predetermined constant.

In the present aspect, the thickness of each layer of the above optical multilayered film is controlled so that the reflectance of the incident light of the particular wavelength λ directed toward the light reflective layer has a value between a local minimum and a neighborhood value of the local minimum. Being between the local minimum and the neighborhood value of the local minimum, the reflectance has small variations even when the thickness of each layer of the optical multilayered film varies.

With this, the light emitted from an exposure device directly to the photosensitive resin layer and a total amount of the light reflected from the light reflective layer and reaching the photosensitive resin layer can be made almost constant.

As a result, it is possible to reduce errors in shape of the photosensitive resin layer of the organic EL elements formed from the photosensitive resin layer, and the thicknesses of the luminous function layers formed in regions isolated by the photosensitive resin layers in an ink coating process such as an inkjet process can therefore be made the same. Consequently, it is possible to provide an organic EL display apparatus with excellent in-plane uniformity of luminescence characteristics.

Furthermore, what is used to control the reflectance of the incident light to be between the local minimum and the neighborhood value of the local minimum is the above optical multilayered film itself included in the organic EL element. This means that according to the present aspect, no other members than the above optical multilayered film included in the organic EL element need to be used to control the reflectance of the incident light to be between the local minimum and the neighborhood value of the local minimum.

Thus, the thickness of each layer of the above optical multilayered film included in the organic EL element is controlled to set the reflectance of the incident light to be between the local minimum and the neighborhood value of the local minimum, with the result that errors in shape of formed banks of the organic EL elements can be reduced without adding unnecessary members for the resultant organic EL elements and without additional processes for forming such unnecessary members. That is, it is possible to provide an organic EL display apparatus with excellent in-plane uniformity of luminescence characteristics with a simple structure and in a simple manufacturing process.

Furthermore, the particular wavelength λ may be one of a wavelength within a range of plus and minus five percent from a wavelength of g line, a wavelength within a range of plus and minus five percent from a wavelength of h line, and a wavelength within a range of plus and minus five percent from a wavelength of i line.

In the present aspect, the particular wavelength λ is one of a wavelength within a range of plus and minus five percent from the wavelength of g line, a wavelength within a range of plus and minus five percent from the wavelength of h line, and a wavelength within a range of plus and minus five percent from the wavelength of i line.

By setting the particular wavelength λ within the range of plus and minus five percent from the wavelength of light to be used in the exposure process as above, it is possible to set the reflectance to be in the neighborhood of the local minimum. The reflectance indicates a ratio of the light used in the exposure process, reflected on the light reflective layer and then directed toward the photosensitive resin layer. Changes in intensity of the reflection can be small in the neighborhood of the local minimum, with the result that the variations in intensity of the light reflected on the light reflective layer and then directed toward the photosensitive resin layer can be very small.

It is therefore possible to provide an organic EL display apparatus with reduced errors in shape of formed banks of organic EL elements and excellent in-plane uniformity of luminescence characteristics.

Furthermore, the incident light of the particular wavelength λ may be used to irradiate the photosensitive resin layer in the process of forming the bank that isolates the luminous function layer from the photosensitive resin layer.

According to the present aspect, the incident light of the particular wavelength λ is used to irradiate the photosensitive resin layer in the process of forming the bank that isolates the luminous function layer from the photosensitive resin layer.

Furthermore, the photosensitive resin layer may be made of a material which absorbs incident light of a particular wavelength λ in a process of forming a bank by exposing the photosensitive resin layer to the incident light, which bank isolates the luminous function layer. The photosensitive resin layer may cure by absorbing the incident light of the particular wavelength λ or may become soluble in a predetermined solvent by absorbing the incident light of the particular wavelength λ.

According to the present aspect, the photosensitive resin layer is made of a material which absorbs the light of the particular wavelength λ at least in the process of forming the bank. Because the photosensitive resin layer efficiently absorbs the light used in the exposure, it is easy to form the bank from the photosensitive resin layer, which is preferred.

The organic EL display apparatus according to an aspect of the present invention includes a plurality of the organic EL elements described above.

In the organic EL display apparatus according to the present aspect, the banks have a uniform shape and the organic EL elements are arranged. Accordingly, even when the organic EL display apparatus is structured with a plurality of the organic EL elements, the thicknesses of the luminous function layers can be the same. It is therefore possible to provide an organic EL display apparatus with luminescence characteristics which are uniform in a plane of the display apparatus. This is preferred in implementation of especially a large-screen organic EL display apparatus.

An organic electro-luminescence (EL) element according to an aspect of the present invention includes: a light refractive layer, a transparent electrode layer, a hole transport layer, and a photosensitive resin layer that are stacked on a substrate; a luminous function layer isolated by the photosensitive resin layer; and a second transparent electrode layer provided above the luminous function layer, wherein the light reflective layer, the transparent electrode layer, and the hole transport layer are formed on the substrate in a region isolated by the photosensitive resin layer, the photosensitive resin layer is made of a material which absorbs incident light of a particular wavelength λ in a process of forming a bank by exposing the photosensitive resin layer to the incident light, the bank isolating the luminous function layer, a thickness of each of the transparent electrode layer, the hole transport layer, and the photosensitive resin layer that are included in an optical multilayered film is set such that reflectance has a value between a local minimum and a neighborhood value of the local minimum, the reflectance being a ratio of reflection of the incident light which is reflected on the light reflective layer and directed toward the photosensitive resin layer, to the incident light directed from a side of the photosensitive resin layer toward the light reflective layer, and the particular wavelength λ satisfies the following:

$$d1 = 1/n1 \times 1.8 \times \lambda/4$$

$$d2 = 1/n2 \times 0.8a \times \lambda/4$$

$$d4 = 1/n4 \times 0.2a \times \lambda/4$$

where d1 is the thickness of the transparent electrode layer, d2 is the thickness of the hole transport layer, d4 is the thickness of the photosensitive resin layer, n1 is a refractive index of the transparent electrode layer, n2 is a refractive index of the hole transport layer, n4 is a refractive index of the photosensitive resin layer, and a is a predetermined constant.

According to the present aspect, the organic EL element has a simple structure without the insulation layer. The organic EL element in the present aspect is therefore simple and produces the same or like effects as in the above aspect.

Furthermore, the particular wavelength λ may be one of a wavelength within a range of plus and minus five percent from a wavelength of g line, a wavelength within a range of plus and minus five percent from a wavelength of h line, and a wavelength within a range of plus and minus five percent from a wavelength of i line.

In the present aspect, the particular wavelength λ is one of a wavelength within a range of plus and minus five percent from the wavelength of g line, a wavelength within a range of plus and minus five percent from the wavelength of h line, and a wavelength within a range of plus and minus five percent from the wavelength of i line.

By setting the particular wavelength λ within a range of plus and minus five percent from the wavelength of light to be used in the exposure process as above, it is possible to set the reflectance to be in the neighborhood of the local minimum. The reflectance indicates a ratio of the light used in the exposure process, reflected on the light reflective layer and then directed toward the photosensitive resin layer. Changes in intensity of the reflection can be small in the neighborhood of the local minimum, with the result that the variations in intensity of the light reflected on the light reflective layer and then directed toward the photosensitive resin layer can be very small.

It is therefore possible to provide an organic EL display apparatus with reduced errors in shape of formed photosensitive resin layers of organic EL elements and excellent in-plane uniformity of luminescence characteristics.

Furthermore, the incident light of the particular wavelength λ may be used to irradiate the photosensitive resin layer in the process of forming the bank that isolates the luminous function layer from the photosensitive resin layer.

According to the present aspect, the incident light of the particular wavelength λ is used to irradiate the photosensitive resin layer in the process of forming the bank that isolates the luminous function layer from the photosensitive resin layer.

Furthermore, the photosensitive resin layer may be made of a material which absorbs incident light of a particular wavelength λ in a process of forming a bank by exposing the photosensitive resin layer to the incident light, which bank isolates the luminous function layer. The photosensitive resin layer may cure by absorbing the incident light of the particular wavelength λ or may become soluble in a predetermined solvent by absorbing the incident light of the particular wavelength λ.

According to the present aspect, the photosensitive resin layer is made of a material which absorbs the light of the particular wavelength λ at least in the process of forming the bank. Because the photosensitive resin layer efficiently absorbs the light used in the exposure, it is easy to form the bank from the photosensitive resin layer, which is preferred.

The organic EL display apparatus according to an aspect of the present invention includes a plurality of the organic EL elements described above.

In the organic EL display apparatus according to the present aspect, the banks have a uniform shape and the organic EL elements are arranged. Accordingly, even when the organic EL display apparatus is structured with a plurality of the organic EL elements, the thicknesses of the luminous function layers can be the same. It is therefore possible to provide an organic EL display apparatus with luminescence characteristics which are uniform in a plane of the display apparatus. This is preferred in implementation of especially a large-screen organic EL display apparatus.

A manufacturing method of an organic electro-luminescence (EL) element according to an aspect of the present invention includes: stacking, on a substrate, a light refractive layer, a transparent electrode layer, a hole transport layer, an insulation layer, and a photosensitive resin layer; removing part of the photosensitive resin layer by irradiating the photosensitive resin layer with light of a wavelength λ; forming a luminous function layer in a recess of the photosensitive resin layer, the recess being formed by the removing; and providing a second transparent electrode layer above the luminous function layer, wherein the light reflective layer, the transparent electrode layer, the hole transport layer, and the insulation layer are formed on the substrate in a region isolated by the photosensitive resin layer, the photosensitive resin layer is made of a material which absorbs incident light of a particular wavelength λ in a process of forming a bank by exposing the photosensitive resin layer to the incident light, the bank isolating the luminous function layer, and in an optical multilayered film having the transparent electrode layer, the hole transport layer, the insulation layer, and the photosensitive resin layer such that reflectance has a value between a local minimum and a neighborhood value of the local minimum, the reflectance being a ratio of reflection of the incident light which is reflected on the light reflective layer and directed toward the photosensitive resin layer, to the incident light directed from a side of the photosensitive resin layer toward the light reflective layer, the particular wavelength λ satisfies the following:

$$d1 = 1/n1 \times 4.0a \times \lambda/4$$

$$d2 = 1/n2 \times 1.0a \times \lambda/4$$

$$d3 = 1/n3 \times 7.0a \times \lambda/4$$

$$d4 = 1/n4 \times 5.0a \times \lambda/4$$

where d1 is a thickness of the transparent electrode layer, d2 is a thickness of the hole transport layer, d3 is a thickness of the insulation layer, d4 is a thickness of the photosensitive resin layer, n1 is a refractive index of the transparent electrode layer, n2 is a refractive index of the hole transport layer, n3 is a refractive index of the insulation layer, n4 is a refractive index of the photosensitive resin layer, and a is a predetermined constant.

The present aspect is to manufacture an organic EL element with the thickness of each layer of the above optical multilayered film controlled so that the reflectance of the incident light of the particular wavelength λ directed toward the light reflective layer has a value between a local minimum and a neighborhood value of the local minimum. It is therefore possible to suppress the variations in the reflectance even when the thickness of each layer of the optical multilayered film varies in a manufacturing process.

As a result, it is possible to reduce errors in shape of the formed photosensitive resin layer of the organic EL elements, and the thicknesses of the luminous function layers formed in regions isolated by the photosensitive resin layers in an ink coating process such as an inkjet process can therefore be made the same. Consequently, it is possible to provide an organic EL display apparatus with excellent in-plane uniformity of luminescence characteristics.

Furthermore, what is used to control the reflectance of the incident light to be between the local minimum and the neighborhood value of the local minimum is the above optical multilayered film itself included in the organic EL element. This means that according to the present aspect, no other members than the above optical multilayered film included in the organic EL element need to be used to control the reflectance of the incident light to be between the local minimum and the neighborhood value of the local minimum.

Thus, the thickness of each layer of the above optical multilayered film included in the organic EL element is controlled to set the reflectance of the incident light to be between the local minimum and the neighborhood value of the local minimum, with the result that errors in shape of formed photosensitive resin layers of the organic EL elements can be reduced without additional processes. That is, it is possible to provide an organic EL display apparatus with excellent in-plane uniformity of luminescence characteristics with a simple structure and in a simple manufacturing process.

A manufacturing method of an organic electro-luminescence (EL) element according to an aspect of the present invention includes: stacking, on a substrate, a light refractive layer, a transparent electrode layer, a hole transport layer, and a photosensitive resin layer; removing part of the photosensitive resin layer by irradiating the photosensitive resin layer with light of a wavelength λ; forming a luminous function layer in a recess of the photosensitive resin layer, the recess being formed by the removing; and providing a second transparent electrode layer above the luminous function layer, wherein the light reflective layer, the transparent electrode layer, and the hole transport layer are formed on the substrate in a region isolated by the photosensitive resin layer, the photosensitive resin layer is made of a material which absorbs incident light of a particular wavelength λ in a process of forming a bank by exposing the photosensitive resin layer to the incident light, the bank isolating the luminous function layer, and in an optical multilayered film having the transparent electrode layer, the hole transport layer, and the photosensitive resin layer such that reflectance has a value between a local minimum and a neighborhood value of the local minimum, the reflectance being a ratio of reflection of the incident light which is reflected on the light reflective layer and directed toward the photosensitive resin layer, to the incident light directed from a side of the photosensitive resin layer toward the light reflective layer, the particular wavelength λ satisfies the following:

$$d1 = 1/n1 \times 1.8 \times \lambda/4$$

$$d2 = 1/n2 \times 0.8a \times \lambda/4$$

$$d4 = 1/n4 \times 0.2a \times \lambda/4$$

where d1 is a thickness of the transparent electrode layer, d2 is a thickness of the hole transport layer, d4 is a thickness of the photosensitive resin layer, n1 is a refractive index of the transparent electrode layer, n2 is a refractive index of the hole transport layer, n4 is a refractive index of the photosensitive resin layer, and a is a predetermined constant.

The present aspect provides a manufacturing method of the simple organic EL element without the insulation layer. Accordingly, the present aspect provides a simpler manufacturing method and produces the same or like effects as in the above aspects.

The organic EL element and the organic EL display apparatus according to an embodiment of the present invention are described below in detail with reference to the drawings. It is to be noted that the width and thickness of each component on the drawings are not precise for convenience of explanation.

(Example of Structure of Organic EL Element)

FIG. 1 is a cross-section diagram showing one example of a structure of the organic EL element 10 according to an embodiment of the present invention, in which banks have not yet been formed.

As shown in FIG. 1, the organic EL element 10 in which banks have not yet been formed includes: a transparent substrate 11; a light reflective layer 12 on the substrate 11; a transparent electrode layer 13 formed on the top surface of the light reflective layer 12; an insulation layer 14 formed on the top surface of the transparent electrode layer 13; a hole transport layer 15 formed on the top surface of the insulation layer 14; and a photosensitive resin layer 16 formed over the hole transport layer 15.

In the case where the light reflective layer 12 is used as a pixel electrode, one light reflective layer 12 is separate from another light reflective layer 12 for each organic EL element 10. In addition, the substrate 11 may have a drive circuit including a thin-film transistor for supplying luminescence drive current to the organic EL element 10 via the light reflective layer 12 acting as a pixel electrode.

From the organic EL element 10 in the state shown in FIG. 1, the photosensitive resin layer 16 is partially removed to form recesses for placing luminous function layers for the respective organic EL elements 10. The remaining photosensitive resin layer 16 that has not removed serves as a bank.

In order to form banks, a light source (not shown) emits light 17 for exposure to the photosensitive resin layer 16. The light 17 for exposure emitted to the photosensitive resin layer 16 passes through the hole transport layer 15, the insulation layer 14, and the transparent electrode layer 13, and reaches the light reflective layer 12. The light reached the light reflective layer 12 is totally reflected on the light reflective layer 12 made of a total reflection metal film and is thus directed toward the photosensitive resin layer 16. Of the reflection of the light 17 returned to the photosensitive resin layer 16, some is transmitted through the photosensitive resin layer 16 and thus emitted outward while some is reflected again toward the light reflective layer 12.

That is, light interference occurs due to the repeated transmission and reflection of the light in an optical multilayered film 18 having a four-layer structure of the light reflective layer 12, the transparent electrode layer 13, the insulation layer 14, the hole transport layer 15, and the photosensitive resin layer 16.

It is contemplated that adjustments on the thickness of each layer interposed between the light reflective layer 12 and the photosensitive resin layer 16 to an optimum optical path length according to the wavelength of the light 17 based on such an interference phenomenon can locally minimize the reflectance of the optical multilayered film 18 for light of a particular wavelength for irradiating the photosensitive resin layer 16.

With respect to the variations in thickness of each layer of the optical multilayered film 18, the variations in reflectance of light of wavelengths close to the wavelength of the light having the local minimum reflectance are smaller than the variations in reflectance of light of other wavelengths. Each layer of the optical multilayered film 18 is therefore set to have a thickness such that the light of a particular wavelength $\lambda$ in the range of plus and minus five percent from the wavelength of the light 17 has the local minimum reflectance, and when the photosensitive resin layer 16 is exposed to the light 17, it is expected that the variations in intensity of reflected light due to differences in thickness of each layer of the optical multilayered film 18 are small, resulting in reduced errors in shape of formed banks.

Especially, the organic EL display apparatus in which a plurality of organic EL elements 10 are placed in a plane is expected to have improved uniformity of luminescence characteristics in the plane and thus reduced variations in luminance.

The inventors searched in simulations for the thickness of each layer of the organic multilayered film 18 with which the above effects can be obtained.

A condition for the simulations is an optical path length of each layer interposed between the light reflective layer 12 and the photosensitive resin layer 16.

Specifically, the first condition was set as follows:

$$d1 = 1/n1 \times c1 \times \lambda/4$$

$$d2 = 1/n2 \times c2 \times \lambda/4$$

$$d3 = 1/n3 \times c3 \times \lambda/4$$

$$d4 = 1/n4 \times c4 \times \lambda/4$$

where d1 is the geometric thickness of the transparent electrode layer 13, d2 is the geometric thickness of the hole transport layer 15, d3 is the geometric thickness of the insulation layer 14, d4 is the geometric thickness of the photosensitive resin layer 16, n1 is the refractive index of the transparent electrode layer 13, n2 is the refractive index of the hole transport layer 15, n3 is the refractive index of the insulation layer 14, n4 is the refractive index of the photosensitive resin layer 16, c1, c2, c3, and c4 are coefficients, and $\lambda$, is a wavelength. For the refractive indices n1 to n4, commonly known values for materials of the respective layers were used. In consideration of the refractive indices being functions of the wavelength $\lambda$, one wavelength of the light for irradiating the photosensitive resin layer 16 was determined, and the refractive indices corresponding to that wavelength were used. Specific values of the refractive indices of the respective layers will be described later in detail.

Under the first condition set as above, characteristics of the reflectance of the optical multilayered film 18 with respect to the wavelength $\lambda$ were obtained for all combinations of values of the coefficients c1 to c4 each of which changed from 1.0 to 8.0 at an interval of 0.2.

As the values of the coefficients c1 to c4 with which the light of a wavelength close to the wavelengths of g line, h line, and i line has the local minimum reflectance, the values of the coefficients were specified as follows: c1=4.0, c2=1.0, c3=7.0, and c4=5.0.

Furthermore, a constant a that is common to the respective layers is introduced, and under the following second condition:

$$d1 = 1/n1 \times 4.0a \times \lambda/4$$

$$d2 = 1/n2 \times 1.0a \times \lambda/4$$

$$d3 = 1/n3 \times 7.0a \times \lambda/4$$

$$d4 = 1/n4 \times 5.0a \times \lambda/4$$

the range of the constant a was searched and it was found that with the constant a of 1, 2, or 3, the reflectance has a desired local minimum. Specific values of the thicknesses of the respective layers will be described later in detail.

The structure of the organic EL element 10 is described further.

The organic EL element 10 shown in FIG. 1 is formed by stacking, on the substrate 11, the light reflective layer 12, the transparent electrode layer 13, the insulation layer 14, and the hole transport layer 15, each of which has, as a designed value, the geometric thickness satisfying the above second condition. Each of these layers is formed in a well-known process.

The insulation layer 14 has openings formed by patterning. For patterning, a commonly-used method, e.g., dry etching, is used.

On the entire surface of the patterned insulation layer 14, the hole transport layer 15 and the photosensitive resin layer 16 are formed.

By exposing the photosensitive resin layer 16 to the light (such as g line, h line, and i line) of the wavelength $\lambda$ satisfying the above second condition, part of the photosensitive resin layer 16 is removed to form banks.

Figure 2:
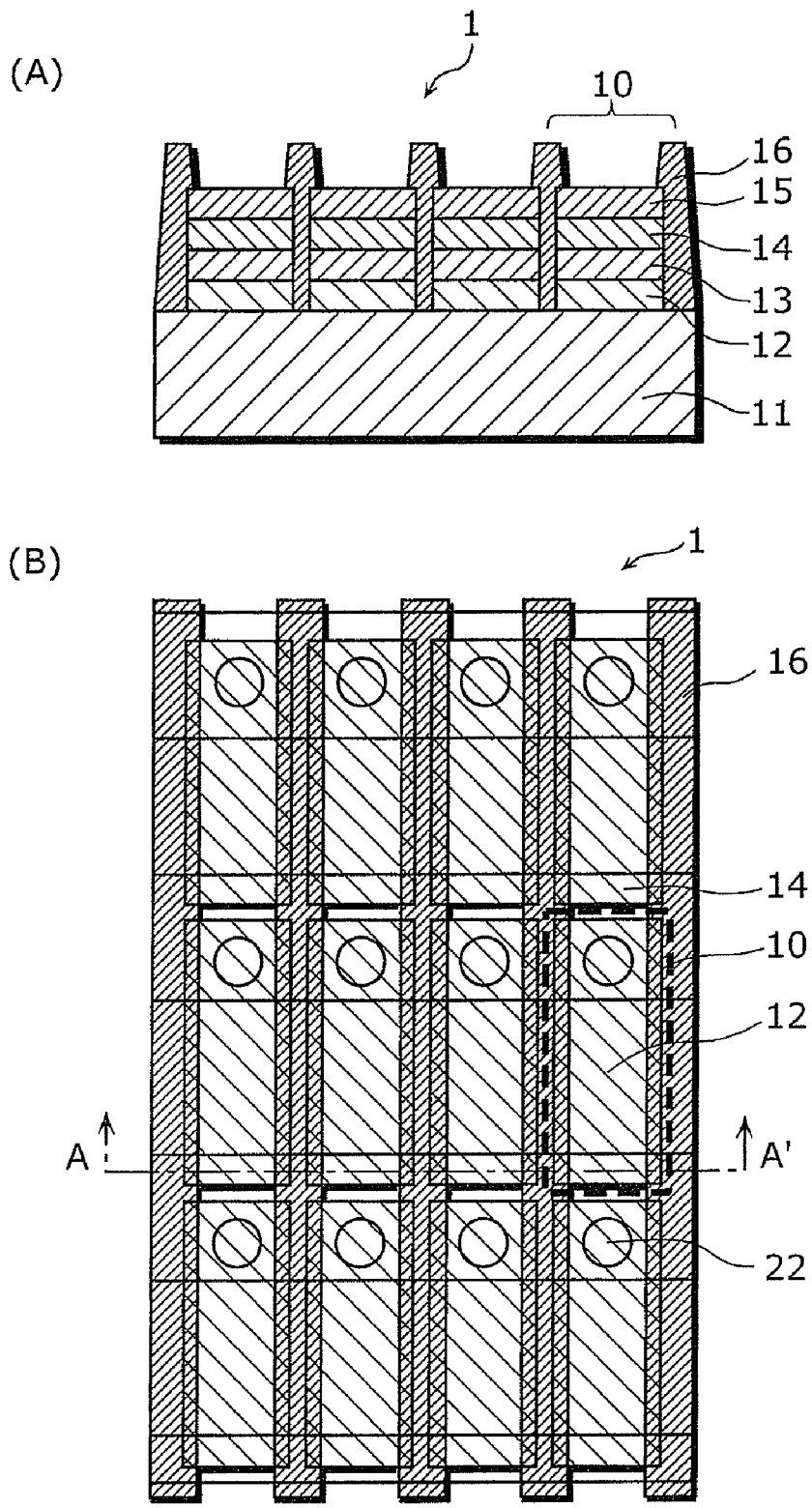
FIGS. 2(A) and 2(B) are a cross-section diagram and a top plan view showing one example of the structure of the organic EL element according to the embodiment of the present invention, in which banks have been formed.

FIGS. 2(A) and 2(B) are a cross-section diagram and a top plan view showing one example of the structure of the organic EL display apparatus 1 including a plurality of organic EL elements 10, in which banks have been formed. The cross-section diagram of FIG. 2(A) corresponds to a cross-section along line A-A' of FIG. 2(B). The top plan view of FIG. 2(B)

shows planar arrangement of main components. For convenience, the bank 16 and the photosensitive resin layer 16 are referred to with the same numerals.

The banks 16 in the organic EL display apparatus 1 are formed linearly along boundaries of the organic EL elements 10 in the lengthwise direction of the drawing sheet. The insulation layer 14 is provided so as to cover gaps of the light reflective layers 12 of the neighboring organic EL elements 10 and contact holes 22, and regulates production of luminescence from the organic EL elements 10 in an area where the production of luminescence is likely to be unstable.

In FIGS. 2(A) and 2(B), the photosensitive resin layers 16 which have not been removed and thus remain become the banks 16. Exposing and removing the photosensitive resin layers 16 are carried out in well-known processes.

At this time, each of the stacked transparent electrode layer 13, the insulation layer 14, the hole transport layer 15, and the photosensitive resin layer 16 has a thickness satisfying the above second condition, with the result that the reflectance of the optical multilayered film 18 is a local minimum with respect to the wavelength of light for exposure. As a result, the variations in intensity of reflected light due to differences in thickness of each layer of the optical multilayered film 18 are small, leading to reduced errors in shapes of the formed banks 16 and thus resulting in the banks 16 with high shape uniformity and reproducibility.

Figure 3:
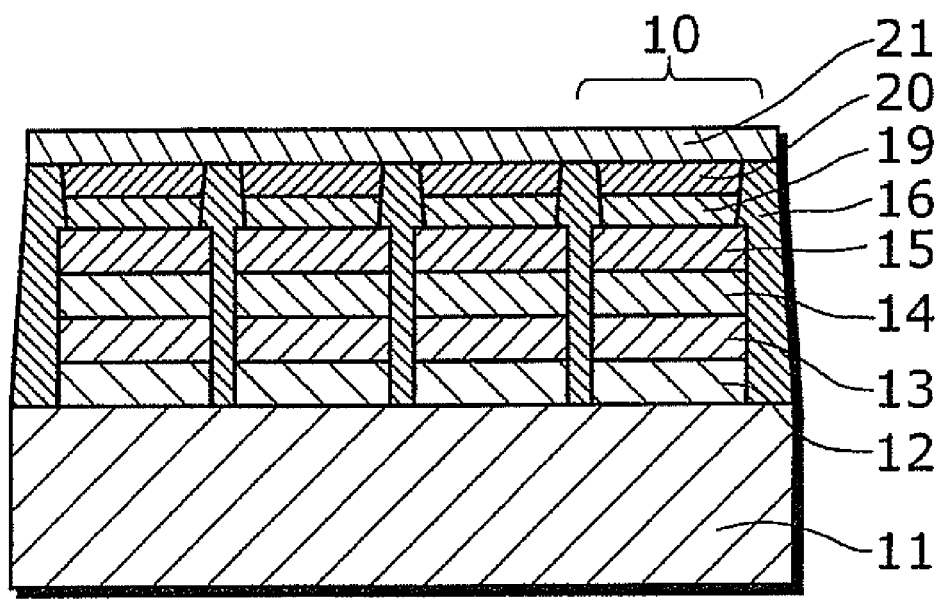
FIG. 3 is a cross-section diagram showing one example of a structure of the organic EL elements according to the embodiment of the present invention, in which luminous function layers have been formed.

FIG. 3 is a cross-section diagram showing one example of a structure of the organic EL display apparatus 1 in which the luminous function layers have been formed; to be specific, in the recess formed by partially removing the photosensitive layer 16, the luminous function layer 19 is formed, and an electron transport layer 20 and a second transparent electrode layer 21 are formed on the luminous function layer 19. Each of these layers is formed in a well-known process. The electron transport layer 20 may or may not be placed.

By allowing current to flow from the light reflective layer 12 to the second transparent electrode layer 21 via the luminous function layer 19 in the organic EL element 10 shown in FIG. 3, the luminous function layer 19 produces light which is emitted in the direction of the second transparent electrode layer 21.

(Example of Material for Each Layer of Organic EL Element)

The organic EL element 10 according to an implementation of the present invention is characterized in the thickness of each of the transparent electrode layer 13, the insulation layer 14, the hole transport layer 15 and the photosensitive layer 16, and usable materials for the organic EL element 10 are, though not limited to, as follows, for example.

The material for the substrate 11 includes: a glass plate made of soda glass, non-fluorescent glass, phosphate glass, or boric-acid glass; quartz; a plastic plate and a plastic film made of acrylic resin, styrene resin, polycarbonate resin, epoxy resin, polyethylene, polyester, or silicone resin; and a metal plate and a metal foil made of alumina.

The material for the light reflective layer 12 includes a metal such as silver (Ag) or aluminum (Al), and plays a role in total reflection of light of a particular wavelength. An alloy such as Ag-Copper-Au (ACA) or Ag-Paradium-Copper (APC) may also be used in consideration of durability.

The transparent electrode layers 13 and 21 are made of conductive materials having sufficient light transmitting properties. As the material for the transparent electrode layers 13 and 21, indium tin oxide (ITO) and indium zinc oxide (IZO) are preferred. This is because these materials provide good conductive properties even when the layers are formed at room temperature.

The hole transport layer 15 may be made of an inorganic material such as $WO_3$ and may also be made of an organic material, for example. The organic material includes, for example, a porphyrin compound, an aromatic tertiary amine compound, and a styryl amine compound disclosed by Japanese Unexamined Patent Application Publication No. 5-163488. The hole injection layer in Japanese Unexamined Patent Application Publication No. 5-163488 corresponds to the hole transport layer according to an implementation of the present invention.

The insulation layer 14 is made of $SiO_2$ or $SiN_x$, for example.

The luminous function layer 19 is made of, for example, an organic compound of various types represented by an oxinoid compound, disclosed by Japanese Unexamined Patent Application Publication No. 5-163488. The luminous function layer 19 is formed by deposition, spin coating, casting, or the like process.

The electron transport layer 20 is made of, for example, an organic compound of various types represented by a nitro-substituted fluorenone derivative disclosed by Japanese Unexamined Patent Application Publication 5-163488.

It is to be noted that the above materials are given as an example for explanation purpose. Each layer of the organic EL element 10 may be made of a material other than the above materials, of which adequacy is known.

EXAMPLES

Next, described are examples in which the thickness of each layer was determined in simulations, then the optical multilayered film 18 having the four-layer structure shown in FIG. 1 was practically fabricated on the substrate 11 so that each layer had the determined thickness as a designed value, and thereafter the banks 16 shown in FIGS. 2(A) and 2(B) were formed from this optical multilayered film 18. The banks 16 were formed in different examples corresponding to the respective lights 17 of g line, h line, and i line.

In the first example, it was assumed that the photosensitive resin layer 16 was exposed to the h line having a wavelength of 405 nm.

First, in the above-mentioned simulations using the refractive index of each layer which corresponded to the h line having a wavelength of 405 nm, preferred values were found; that is, APC of 200 nm in thickness for the light reflective layer 12, ITO of 199.5 nm in thickness and 2.03 in refractive index for the transparent electrode layer 13, $WO_3$ of 43.8 nm in thickness and 2.31 in refractive index for the hole transport layer 15, $SiO_2$ of 475.7 nm in thickness and 1.49 in refractive index for the insulation layer 14, and 316.4 nm in thickness and 1.60 in refractive index for the photosensitive resin layer 16.

Figure 4:
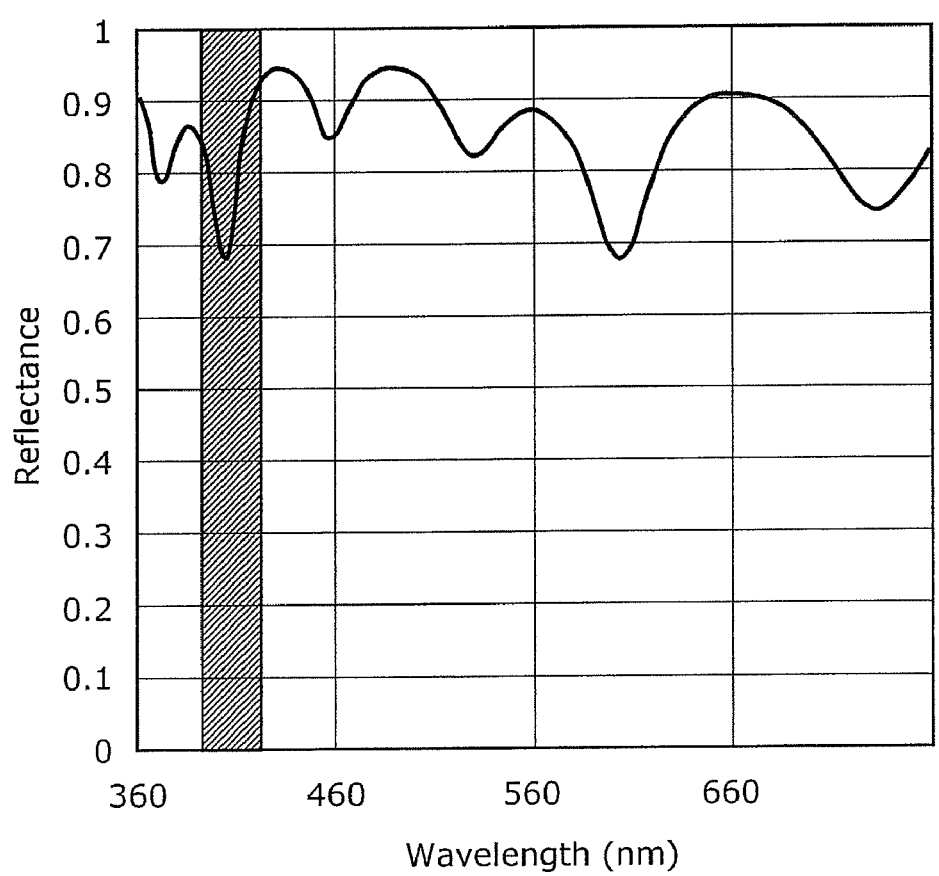
FIG. 4 is a graph showing a simulation result for optical reflectance according to the first example of the present invention.

FIG. 4 shows characteristics of the reflectance of the optical multilayered film relative to wavelengths when the preferred values determined in the above simulations are employed. Referring to FIG. 4, it can be seen that the optical reflectance has a local minimum in the neighborhood of wavelength $\lambda=405$ nm (h line).

Next, using the above preferred values as designed values, the optical multilayered film 18 was formed by using a negative photosensitive material (ZPN 1168 produced by ZEON Corporation) for the photosensitive resin layer 16, and the banks 16 were formed from this optical multilayered film 18. In this case, each of the organic EL elements 10 was designed to have a long side of 300 μm and a short side of 100 μm.

The intensity of illumination by the light of all the wavelengths at the time of exposure was 8.6 $mW/cm^2$ in i line equivalent. The exposure was performed by mainly the h line, using a cut filter having an average transmittance of 90% between 400 nm and 425 nm. The exposure value in this case is equal to three-second irradiation without cut filters, that is, to an exposure value of 25.8 mJ/cm$^2$ in i line equivalent at the time of exposure by the light of all the wavelengths.

After the exposure, the organic EL element 10 was heated on a hot plate of 110° C. for 130 seconds and thereafter, the puddle development was conducted for 180 seconds using 2.38% TMAH developer. After the puddle development, the organic EL element 10 was adequately rinsed with pure water. After the rinsing, the organic EL element 10 was baked in a clean oven at 200° C. for an hour.

Under such conditions, a plurality of the organic EL elements 10 were fabricated on the substrate of 300 mm×300 mm, and in-plane shape uniformity of the banks 16 was evaluated. The evaluation showed that the variations in thickness of the banks were within a range of plus and minus five percent. In addition, the banks 16 were formed on ten substrates under the same conditions. Also in this case, the variations in thickness of the banks 16 among the substrates were within a range of plus and minus five percent.

In the second example, it was assumed that the photosensitive resin layer 16 was exposed to the g line having a wavelength of 436 nm.

First, in the above-mentioned simulations using the refractive index of each layer which corresponded to the g line having a wavelength of 436 nm, preferred values were found; that is, APC of 200 nm in thickness for the light reflective layer 12, ITO of 227.1 nm in thickness and 1.92 in refractive index for the transparent electrode layer 13, WO$_3$ of 50.2 nm in thickness and 2.17 in refractive index for the hole transport layer 15, SiO$_2$ of 522.6 nm in thickness and 1.46 in refractive index for the insulation layer 14, and 340.6 nm in thickness and 1.60 in refractive index for the photosensitive resin layer 16.

Figure 5:
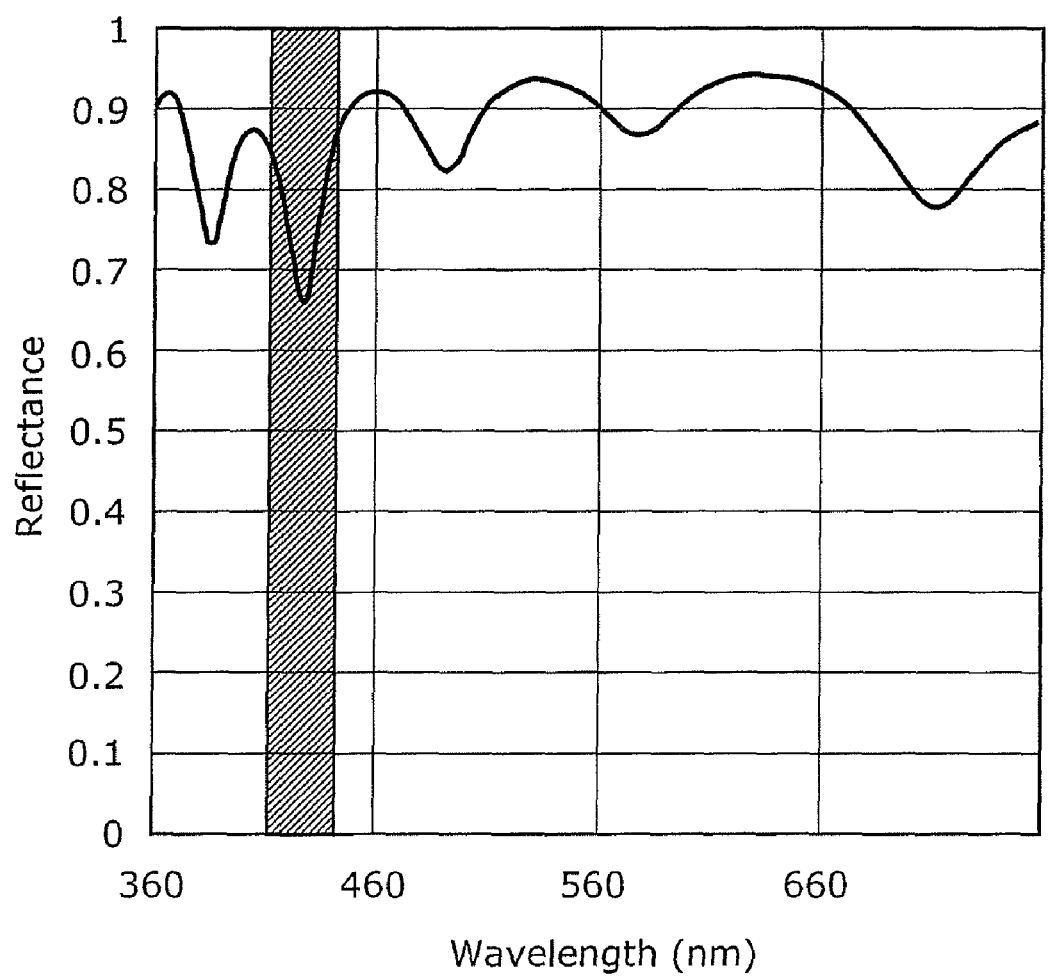
FIG. 5 is a graph showing a simulation result for optical reflectance according to the second example of the present invention.

FIG. 5 shows characteristics of the reflectance of the optical multilayered film relative to wavelengths when the preferred values determined in the above simulations are employed. Referring to FIG. 5, it can be seen that the optical reflectance has a local minimum in the neighborhood of wavelength λ=436 nm (g line).

Next, using the above preferred values as designed values, the optical multilayered film 18 was fabricated by using a negative photosensitive material (ZPN 1168 produced by ZEON Corporation) for the photosensitive resin layer 16, and the banks 16 were formed from this optical multilayered film 18. In this case, each of the organic EL elements 10 was designed to have a long side of 300 μm and a short side of 100 μm.

The intensity of illumination by the light of all the wavelengths at the time of exposure is 8.6 mW/cm$^2$ in i line equivalent. The exposure was performed by mainly the g line, using a cut filter having an average transmittance of 90% in the range of 430 nm and more. The exposure value in this case is equal to six-second irradiation without cut filters, that is, to an exposure value of 51.6 mJ/cm$^2$ in i line equivalent at the time of exposure by the light of all the wavelengths.

After the exposure, the organic EL element 10 was heated on a hot plate of 110° C. for 130 seconds and thereafter, the puddle development was conducted for 180 seconds using 2.38% TMAH developer. After the puddle development, the organic EL element 10 was adequately rinsed with pure water. After the rinsing, the organic EL element 10 was baked in a clean oven at 200° C. for an hour.

Under such conditions, a plurality of the organic EL elements 10 were fabricated on the substrate of 300 mm×300 mm, and in-plane shape uniformity of the banks 16 was evaluated. The evaluation showed that the variations in thickness of the banks were within a range of plus and minus five percent. In addition, the banks 16 were formed on ten substrates under the same conditions. Also in this case, the variations in thickness of the banks 16 among the substrates were within a range of plus and minus five percent.

In the third example, it was assumed that the photosensitive resin layer 16 was exposed to the i line having a wavelength of 365 nm.

First, in the above-mentioned simulations using the refractive index of each layer which corresponded to the i line having a wavelength of 365 nm, preferred values were found; that is, APC of 200 nm in thickness for the light reflective layer 12, ITO of 178.9 nm in thickness and 2.04 in refractive index for the transparent electrode layer 13, WO$_3$ of 38.7 nm in thickness and 2.36 in refractive index for the hole transport layer 15, SiO$_2$ of 434.5 nm in thickness and 1.47 in refractive index for the insulation layer 14, and 228.1 nm in thickness and 1.60 in refractive index for the photosensitive resin layer 16.

Figure 6:
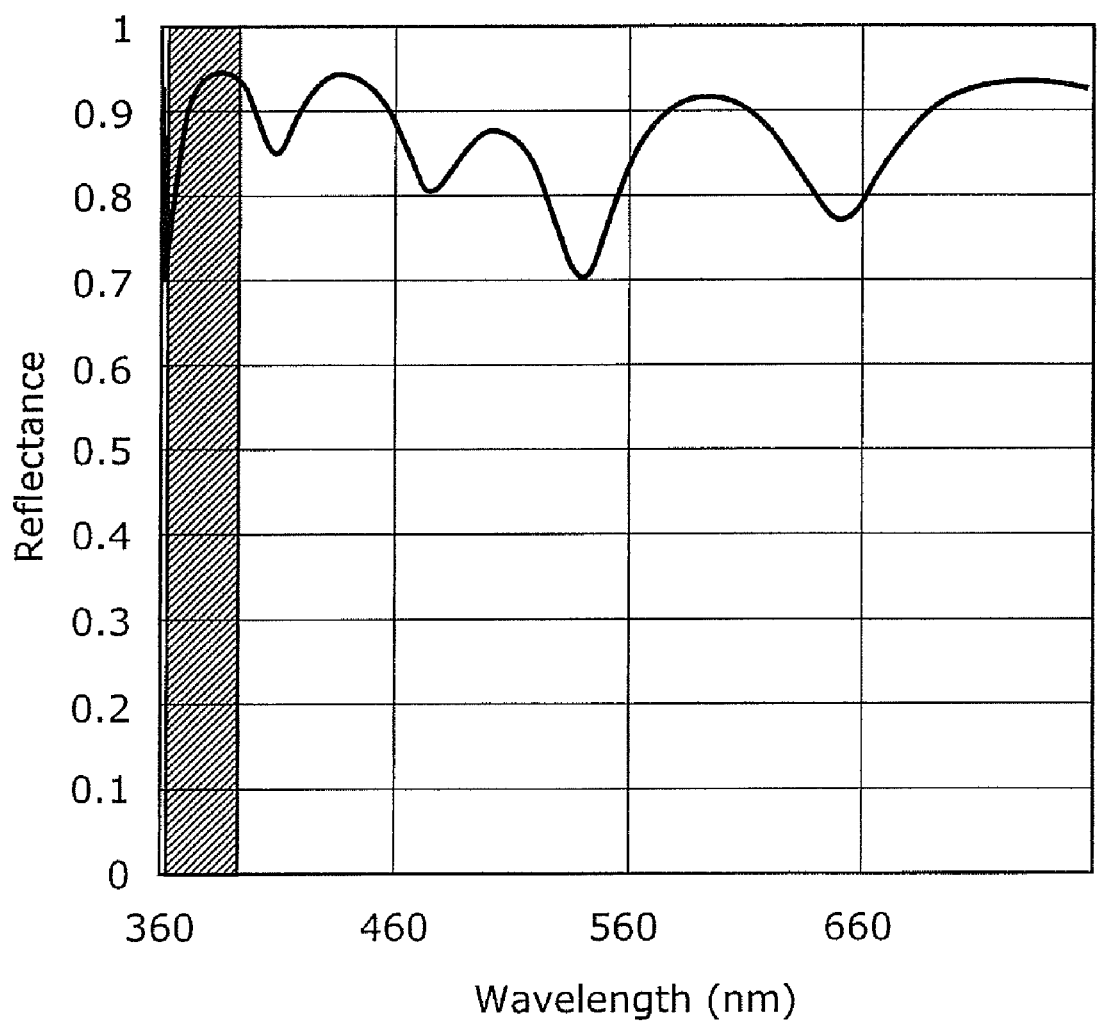
FIG. 6 is a graph showing a simulation result for optical reflectance according to the third example of the present invention.

FIG. 6 shows characteristics of the reflectance of the optical multilayered film relative to wavelengths when the preferred values determined in the above simulations are employed. Referring to FIG. 6, the optical reflectance has a local minimum in the neighborhood of wavelength λ=365 nm (i line).

Next, using the above preferred values as designed values according to the above condition, the optical multilayered film 18 was fabricated by using a negative photosensitive material (ZPN 1168 produced by ZEON Corporation) for the photosensitive resin layer 16, and the banks 16 were formed from this optical multilayered film 18. In this case, each of the organic EL elements 10 was designed to have a long side of 300 μm and a short side of 100 μm.

The intensity of illumination by the light of all the wavelengths at the time of exposure is 8.6 mW/cm$^2$ in i line equivalent. The exposure was performed by mainly the i line, using a cut filter having an average transmittance of 90% in the range of 360 nm and more. The exposure value in this case is equal to one-second irradiation without cut filters, that is, to an exposure value of 8.6 mJ/cm$^2$ in i line equivalent at the time of exposure by the light of all the wavelengths.

After the exposure, the organic EL element 10 was heated on a hot plate of 110° C. for 130 seconds and thereafter, the puddle development was conducted for 180 seconds using 2.38% TMAH developer. After the puddle development, the organic EL element 10 was adequately rinsed with pure water. After the rinsing, the organic EL element 10 was baked in a clean oven at 200° C. for an hour.

Under such conditions, a plurality of the organic EL elements 10 were fabricated on the substrate of 300 mm×300 mm, and in-plane shape uniformity of the banks 16 was evaluated. The evaluation showed that the variations in thickness of the banks were within a range of plus and minus five percent. In addition, the banks 16 were formed on ten substrates under the same conditions. Also in this case, the variations in thickness of the banks 16 among the substrates were within a range of plus and minus five percent.

While photosensitive polyimide produced by ZEON corporation was used in the above-described examples, other photosensitive materials may also be used in the same or like manner as long as they satisfy conditions based on simulations.

Effects obtained when the reflectance of the optical multilayered film 18 is set to be a local minimum with respect to the light for exposure having a particular wavelength are further described with specific examples of shapes of the formed banks 16.

Figure 7:
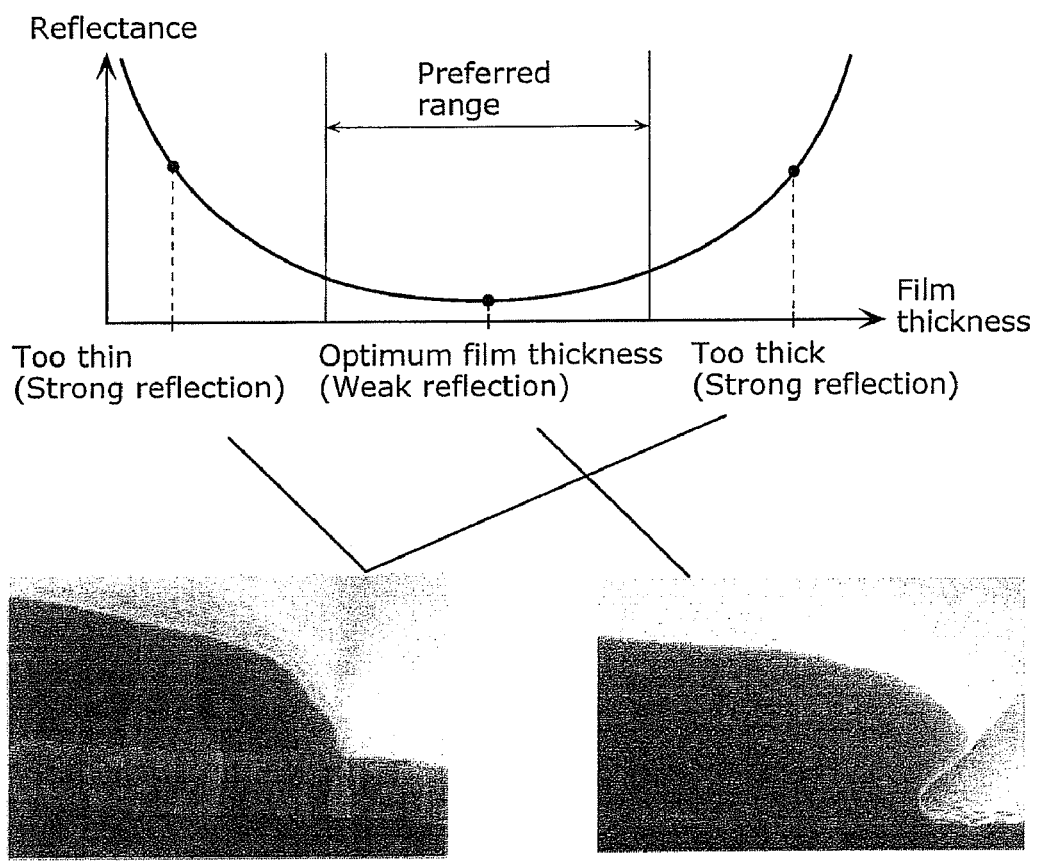
FIG. 7 is a graph showing one example of shapes of formed banks according to reflectance of an optical multilayered film.

FIG. 7 is a graph showing one example of shapes of the formed banks 16 according to reflectance of the optical multilayered film 18.

The graph shown in the upper stage of FIG. 7 shows reflectance of the optical multilayered film 18 relative to the thicknesses of the transparent electrode layer 13, the insulation layer 14, the hole transport layer 15, and the photosensitive resin layer 16.

The thickness of each layer of the transparent electrode layer 13, the insulation layer 14, the hole transport layer 15, and the photosensitive resin layer 16, with which thickness the reflectance of the optical multilayered film 18 is a local minimum, is assumed to be optimum thickness. In this case, when any of the thicknesses of the transparent electrode layer 13, the insulation layer 14, the hole transport layer 15, and the photosensitive resin layer 16 is not the optimum thickness, a desired interference state of lowering the reflectance of the optical multilayered film 18 cannot be obtained, with result that the reflectance of the optical multilayered film 18 increases and the intensity of reflection reaching the photosensitive resin layer 16 increases accordingly.

In the neighborhood of the optimum thickness of each layer, there is a relatively wide preferred range of thickness in which the reflectance of the optical multilayered film 18 varies little and is kept in the neighborhood of the local minimum, but when the thickness of any of the layers is out of the preferred range; that is, with any of the layers being too thick or too thin, then the reflectance increases abruptly.

Suppose the case of using a negative photosensitive material for the photosensitive resin layer 16. With weak reflection, the progress of curing of the photosensitive resin layer 16 around its bottom part is slow, thus resulting in, for example, the bank 16 having a desired shape with an overhang as shown in a cross-section photograph on the right in the lower stage of FIG. 7. With strong reflection, the photosensitive resin layer 16 is cured well on the whole, thus resulting in, for example, the bank 16 having an undesired shape with a gentle slant as shown in a cross-section photograph on the left in the lower stage of FIG. 7.

Figure 8:
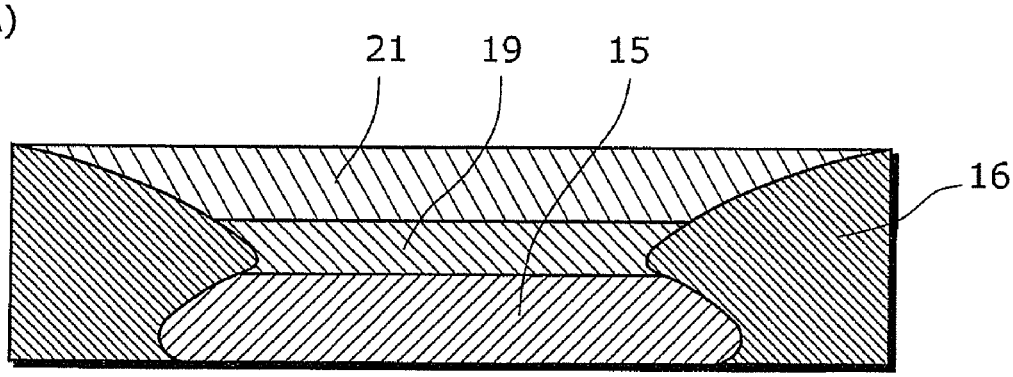
FIGS. 8(A) and 8(B) are diagrams for explaining influences of the banks on an upper structure depending on the shapes of the banks.
Figure 8:
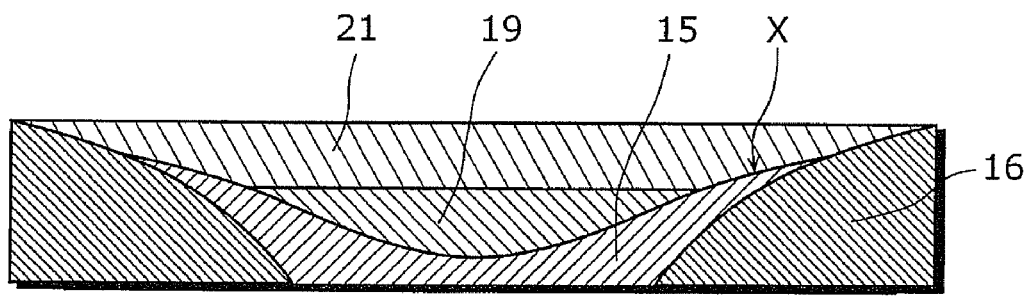

FIGS. 8(A) and 8(B) are diagrams for explaining influences of the banks 16 on an upper structure depending on the shapes of the banks 16.

In the case of the bank 16 having the desired shape as shown in FIG. 8(A), the second transparent electrode layer 21 and the hole transport layer 15 are placed respectively above and below the overhang, and the luminous function layer 19 is placed in a space narrowed by the overhang, thereby resulting in the organic EL element with a preferred structure in which a short circuit between the second transparent electrode layer 21 and the hole transport layer 15 is less likely.

On the other hand, in the case of the bank 16 having the undesired shape as shown in FIG. 8(B), there is a possibility that the luminous function layer 19 becomes very thin in a part (indicated by "X") on the hole transport layer 15, which makes it easier to cause a short-circuit between the second transparent electrode layer 21 and the hole transport layer 15.

It is to be noted that the desired shape shown in FIG. 8(A) is a mere example for explanation. The desired shape may be a shape which not only improves properties of the upper structure but also is defined by various demands, and may also be a shape suitable for the case where a positive photosensitive material is used.

As described above, the shape of the formed bank 16 with the optimum thickness (that is, the local minimum of the reflectance) of each layer of the optical multilayered film 18 is designed as a desired shape, with the result that, because the variations in reflectance relative to a film thickness are small in the neighborhood of the optimum thickness of each layer of the optical multilayered film 18, it is possible to reduce errors in shape of the formed banks 16 relative to the desired shape.

(Another Example of Structure of Organic EL Element)

Next, another example of the organic EL element according to an embodiment of the present invention is described.

Figure 9:
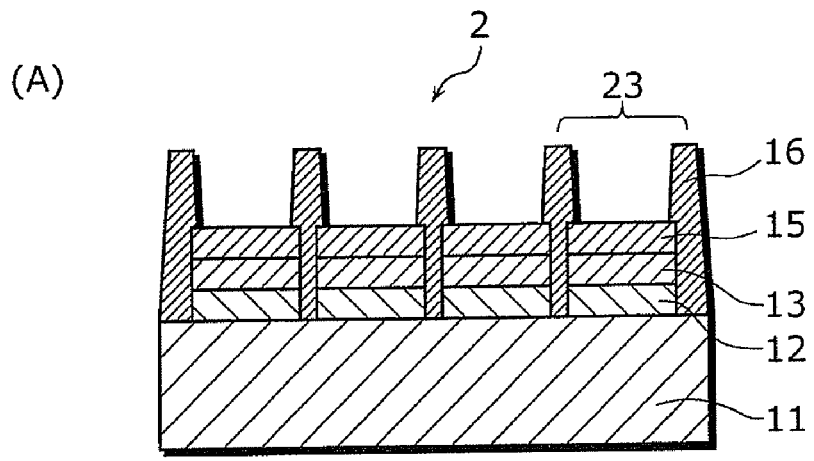
FIGS. 9(A) and 9(B) are a cross-section diagram and a top plan view showing another example of the structure of the organic EL element according to the embodiment of the present invention, in which banks have been formed.
Figure 9:
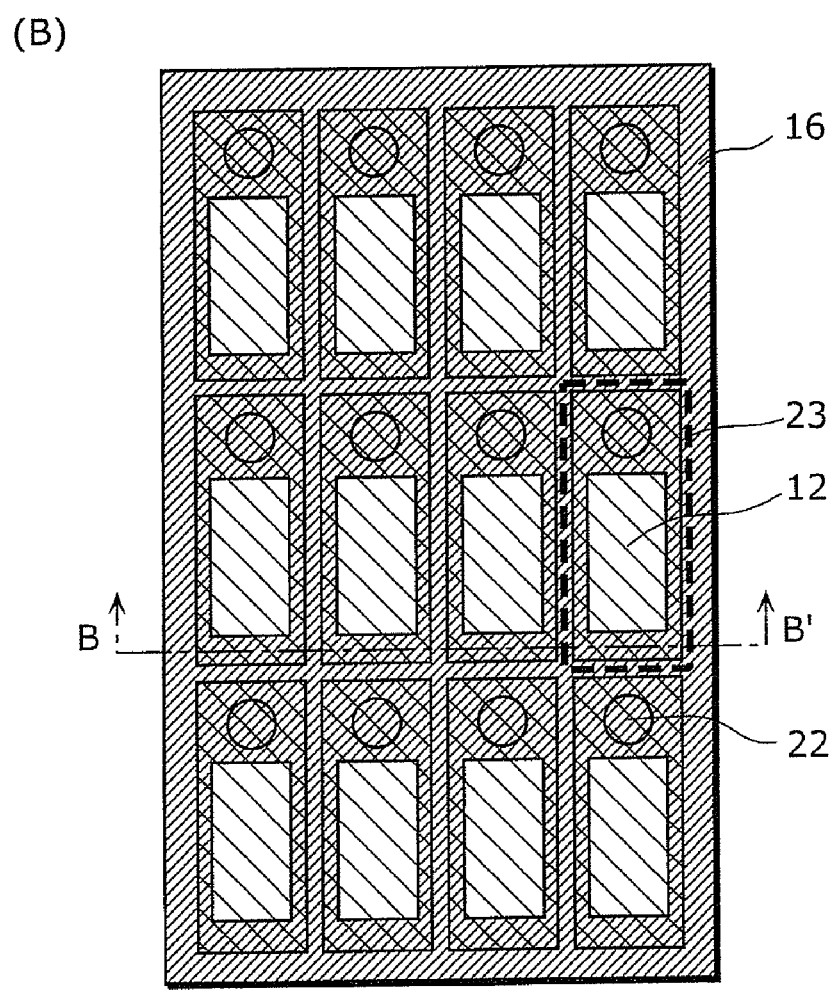

FIGS. 9(A) and 9(B) are a cross-section diagram and a top plan view showing one example of the structure of an organic EL display apparatus 2 including a plurality of organic EL elements 23, in which banks have been formed.

As compared to the organic EL display apparatus 1, the organic EL display apparatus 2 includes no insulation layer 14 and the bank 16 located in a different region. The cross-section diagram of FIG. 9(A) corresponds to a cross-section along line B-B' of FIG. 9(B). The top plan view of FIG. 9(B) shows planar arrangement of main components. In the following description, components that are the same as the components of the organic EL display apparatus 1 are denoted by the same numerals and their explanation is omitted accordingly.

The bank 16 in the organic EL display apparatus 2 is provided so as to cover gaps of the light reflective layers 12 and the contact holes 22 of the neighboring organic EL elements 23, and regulates production of luminescence from the organic EL elements 23 in an area where the production of luminescence is likely to be unstable.

The bank 16 in the organic EL display apparatus 2 is formed by patterning the photosensitive resin layer 16 that is included in an optical multilayered film having a three-layer structure of the transparent electrode layer 13, the hole transport layer 15, and the photosensitive resin layer 16.

In FIGS. 9(A) and 9(B), the photosensitive resin layers 16 which have not been removed and thus remain become the banks 16. Exposing and removing the photosensitive resin layers 16 are carried out in well-known processes.

The inventors verified in simulations that also with such an optical multilayered film having the three-layer structure, the reflectance of the photosensitive resin layer 16 can be locally minimized relative to the wavelength λ of the light for exposure.

Specifically, the third condition was set as follows:

$$d1 = 1/n1 \times c1 \times \lambda/4$$

$$d2 = 1/n2 \times c2 \times \lambda/4$$

$$d4 = 1/n4 \times c4 \times \lambda/4$$

where d1 is the geometric thickness of the transparent electrode layer 13, d2 is the geometric thickness of the hole transport layer 15, d4 is the geometric thickness of the photosensitive resin layer 16, n1 is the refractive index of the transparent electrode layer 13, n2 is the refractive index of the hole transport layer 15, n4 is the refractive index of the photosensitive resin layer 16, c1, c2, and c4 are coefficients, and λ, is a wavelength. For the refractive indices n1, n2, and n4, commonly known values for materials of the respective layers were used. In consideration of the refractive indices being functions of the wavelength λ, one wavelength of the light for irradiating the photosensitive resin layer 16 was determined, and the refractive indices corresponding to that wavelength were used. Specific values of the refractive indices of the respective layers will be described later in detail.

Under the third condition set as above, characteristics of the reflectance of the optical multilayered film with respect to the wavelength λ were obtained for all combinations of values of the coefficients c1, c2, and c4 each of which changed from 1.0 to 8.0 at an interval of 0.2.

As the values of the coefficients c1, c2, and c4 with which the light of a wavelength close to the wavelengths of g line, h line, and i line has the local minimum reflectance, the values of the coefficients were specified as follows: c1=1.8, c2=0.8, and c4=0.2.

Furthermore, a constant a that is common to the respective layers is introduced, and under the following fourth condition:

$$d1=1/n1 \times 1.8a \times \lambda/4$$

$$d2=1/n2 \times 0.8a \times \lambda/4$$

$$d4=1/n4 \times 0.2a \times \lambda/4$$

the range of the constant a was searched and it was found that with the constant a of 1, 2, or 3, the reflectance has a desired local minimum. Specific values of the thickness of the respective layers will be described later in detail.

Next, the simulations conducted for the optical multilayered film having the three-layer structure are described in detail.

Assuming that the photosensitive resin layer 16 was exposed to i line having a wavelength of 365 nm, the above-described simulations were conducted using the refractive index of each layer which corresponded to the i line, and preferred values were thereby found; that is, APC of 200 nm in thickness for the light reflective layer 12, ITO of 80.5 nm in thickness and 2.04 in refractive index for the transparent electrode layer 13, WO₃ of 35.8 nm in thickness and 2.36 in refractive index for the hole transport layer 15, and 11.4 nm in thickness and 1.60 in refractive index for the photosensitive resin layer 16.

Figure 10:
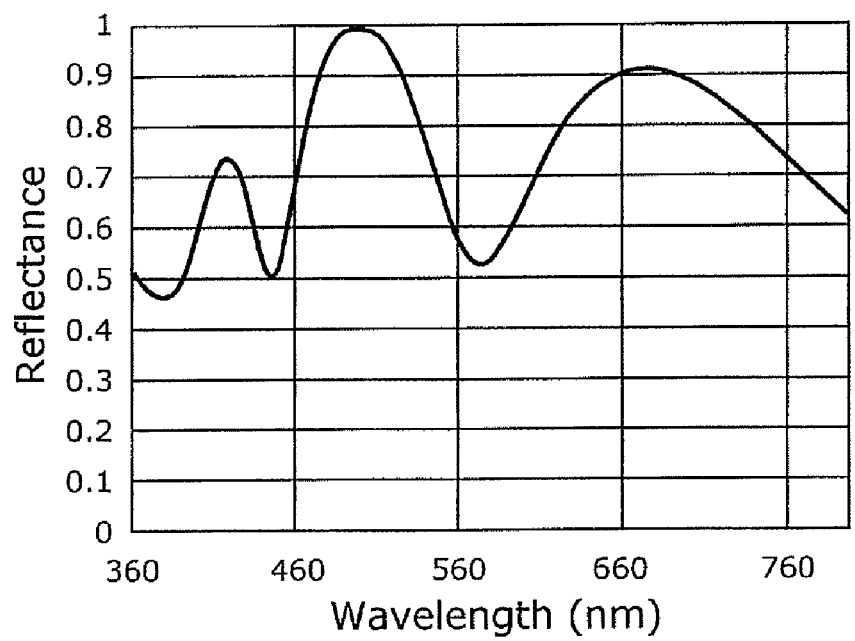
FIG. 10 is a graph showing a simulation result for optical reflectance according to an implementation of the present invention.

FIG. 10 shows characteristics of the reflectance of the optical multilayered film relative to wavelengths when the preferred values determined in the above simulations are employed. Referring to FIG. 10, the optical reflectance has a local minimum in the neighborhood of wavelength λ=365 nm (i line).

Next, assuming that the photosensitive resin layer 16 was exposed to the h line having a wavelength of 405 nm, the above-described simulations were conducted using the refractive index of each layer which corresponded to the h line, and preferred values were thereby found; that is, APC of 200 nm in thickness for the light reflective layer 12, ITO of 89.8 nm in thickness and 2.03 in refractive index for the transparent electrode layer 13, WO₃ of 35.1 nm in thickness and 2.31 in refractive index for the hole transport layer 15, and 12.7 nm in thickness and 1.60 in refractive index for the photosensitive resin layer 16.

Figure 11:
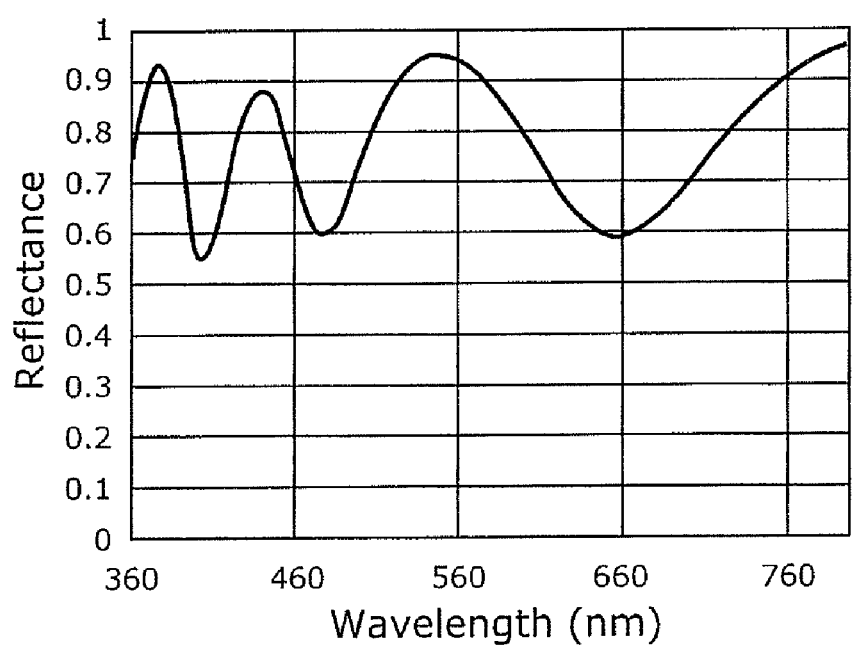
FIG. 11 is a graph showing a simulation result for optical reflectance according to an implementation of the present invention.

FIG. 11 shows characteristics of the reflectance of the optical multilayered film relative to wavelengths when the preferred values determined in the above simulations are employed. Referring to FIG. 11, the optical reflectance has a local minimum in the neighborhood of wavelength λ=405 nm (h line).

Furthermore, assuming that the photosensitive resin layer 16 was exposed to the g line having a wavelength of 436 nm, the above-described simulations were conducted using the refractive index of each layer which corresponded to the g line, and preferred values were thereby found; that is, APC of 200 nm in thickness for the light reflective layer 12, ITO of 100 nm in thickness and 1.92 in refractive index for the transparent electrode layer 13, WO₃ of 40.2 nm in thickness and 2.17 in refractive index for the hole transport layer 15, and 13.6 nm in thickness and 1.60 in refractive index for the photosensitive resin layer 16.

Figure 12:
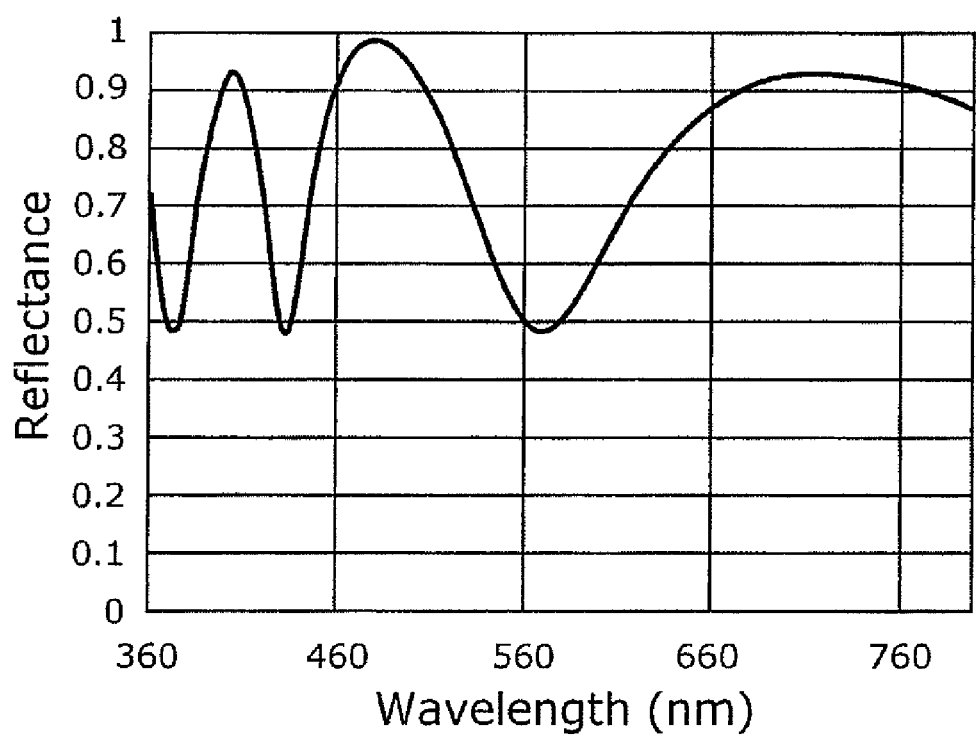
FIG. 12 is a graph showing a simulation result for optical reflectance according to an implementation of the present invention.

FIG. 12 shows characteristics of the reflectance of the optical multilayered film relative to wavelengths when the preferred values determined in the above simulations are employed. Referring to FIG. 12, the optical reflectance has a local minimum in the neighborhood of wavelength λ=436 nm (g line).

As above, also for the optical multilayered film having the three-layer structure, there are the preferred values of the thickness of each layer with which the reflectance of the optical multilayered film is locally minimized. Thus, by fabricating the organic EL display apparatus 2 with such preferred values as designed values, it is possible to produce the same effects as those described above.

While the present examples describe the organic EL elements, an organic EL display which integrates these organic EL elements as pixels on a substrate may also be implemented by appropriately setting the thickness of each layer.

Although only an exemplary embodiment of this invention has been described in detail above, those skilled in the art will readily appreciate that many modifications are possible in the exemplary embodiment without materially departing from the novel teachings and advantages of this invention. Accordingly, all such modifications are intended to be included within the scope of this invention.

INDUSTRIAL APPLICABILITY

The present invention is applicable to an organic EL display for use in a surface light source, a flat display, and the like.

What is claimed is:
1. An organic electro-luminescence (EL) element, comprising:
a substrate; and
a light reflective layer, a first transparent electrode layer, an insulation layer, a hole transport layer, and a plurality of banks being stacked above the substrate;
a luminous function layer above the hole transport layer in a recess defined by the plurality of banks; and
a second transparent electrode layer above the luminous function layer,
wherein the light reflective layer, the first transparent electrode layer, the insulation layer, and the hole transport layer are stacked above the substrate in a region isolated by the plurality of banks,
the plurality of banks comprises a material that absorbs incident light of a predetermined wavelength during a process of forming the plurality of banks by exposing a photosensitive resin layer to the incident light, the process of forming the plurality of banks defining the recess for the luminous function layer,
the first transparent electrode layer, the insulation layer, and the hole transport layer are part of an optical multi-layer film, each having a reflectance value that is between a local minimum value and a neighborhood value of the local minimum value, the reflectance value being a ratio of reflection of the incident light that is reflected from the light reflective layer toward the photosensitive resin layer to the incident light that is directed from the photosensitive resin layer toward the light reflective layer during the process of forming the plurality of banks, and the predetermined wavelength is λ and satisfies:

$$d1 = 1/n1 \times 4.0a \times \lambda/4;$$

$$d2 = 1/n2 \times 1.0a \times \lambda/4;$$

$$d3 = 1/n3 \times 7.0a \times \lambda/4; \text{ and}$$

$$d4 = 1/n4 \times 5.0a \times \lambda/4, \text{ wherein}$$

d1 is a thickness of the first transparent electrode layer,
d2 is a thickness of the hole transport layer,
d3 is a thickness of the insulation layer,
d4 is a thickness of the plurality of banks above the hole transport layer,
n1 is a refractive index of the first transparent electrode layer,
n2 is a refractive index of the hole transport layer,
n3 is a refractive index of the insulation layer,
n4 is a refractive index of the photosensitive resin layer from which the plurality of banks is formed, and
a is a predetermined constant.

2. The organic EL element according to claim 1, wherein the predetermined wavelength is within approximately five percent from a wavelength of one of a G-line, a H-line, and an I-line.

3. The organic EL element according to claim 1, wherein the incident light of the predetermined wavelength irradiates the photosensitive resin layer during the process of forming the plurality of banks that defines the recess for the luminous function layer.

4. The organic EL element according to claim 1, wherein the photosensitive resin layer absorbs the incident light of the predetermined wavelength and one of cures and becomes soluble in a predetermined solvent.

5. An organic EL display apparatus comprising a plurality of the organic EL element according to claim 1.

6. An organic electro-luminescence (EL) element, comprising:
a substrate;
a reflective layer, a first transparent electrode layer, a hole transport layer, and a plurality of banks that are stacked above the substrate;
a luminous function layer above the hole transport layer in a recess defined by the plurality of banks; and
a second transparent electrode layer above the luminous function layer,
wherein the light reflective layer, the first transparent electrode layer, and the hole transport layer are stacked above the substrate in a region isolated by the plurality of banks,
the plurality of banks comprises a material that absorbs incident light of a predetermined wavelength during a process of forming the plurality of banks by exposing a photosensitive resin layer to the incident light, the process of forming the plurality of banks defining the recess for the luminous function layer,
the first transparent electrode layer and the hole transport layer are part of an optical multilayer film, each having a reflectance value that is between a local minimum value and a neighborhood value of the local minimum value, the reflectance value being a ratio of reflection of the incident light that is reflected from the light reflective layer toward the photosensitive resin layer to the incident light that is directed from the photosensitive resin layer toward the light reflective layer during the process of forming the plurality of banks, and the predetermined wavelength is λ and satisfies:

$$d1 = 1/n1 \times 1.8a \times \lambda/4;$$

$$d2 = 1/n2 \times 0.8a \times \lambda/4; \text{ and}$$

$$d4 = 1/n4 \times 0.2a \times \lambda/4, \text{ wherein}$$

d1 is the thickness of the first transparent electrode layer,
d2 is the thickness of the hole transport layer,
d4 is the thickness of the plurality of banks above the hole transport layer,
n1 is a refractive index of the first transparent electrode layer,
n2 is a refractive index of the hole transport layer,
n4 is a refractive index of the photosensitive resin layer from which the plurality of banks is formed, and
a is a predetermined constant.

7. The organic EL element according to claim 6, wherein the predetermined wavelength is within approximately five percent from a wavelength of one of a G-line, a H-line, and an I-line.

8. The organic EL element according to claim 6, wherein the incident light of the predetermined wavelength irradiates the photosensitive resin layer during the process of forming the plurality of banks that defines the recess for the luminous function layer.

9. The organic EL element according to claim 6, wherein the photosensitive resin layer absorbs the incident light of the predetermined wavelength and one of cures and becomes soluble in a predetermined solvent.

10. An organic EL display apparatus comprising a plurality of the organic EL element according to claim 6.

11. A method of manufacturing an organic electro-luminescence (EL) element, comprising:
stacking, above a substrate, a reflective layer, a first transparent electrode layer having a thickness of d1 and a refractive index of n1, an insulation layer having a thickness of d3 and a refractive index of n3, a hole transport layer having a thickness of d2 and a refractive index of n2, and a photosensitive resin layer having a thickness of d4 and a refractive index of n4;
removing a portion of the photosensitive resin layer by irradiating the photosensitive resin layer with light of a predetermined wavelength;
providing a luminous function layer in a recess formed when the portion of the photosensitive resin layer is removed; and
providing a second transparent electrode layer above the luminous function layer,
wherein the light reflective layer, the first transparent electrode layer, the insulation layer, and the hole transport layer are stacked above the substrate in a region isolated by the photosensitive resin layer,
the photosensitive resin layer comprises a material that absorbs incident light of the predetermined wavelength when the portion of the photosensitive resin layer is removed,
the first transparent electrode layer, the insulation layer, the hole transport layer, and the photosensitive resin layer are an optical multilayer film, each having a reflectance value that is between a local minimum value and a neighborhood value of the local minimum value, the reflectance value being a ratio of reflection of the incident light that is reflected from the light reflective layer toward the photosensitive resin layer to the incident light that is directed from the photosensitive resin layer toward the light reflective layer, and the predetermined wavelength is λ and satisfies:

$d1 = 1/n1 \times 4.0a \times \lambda/4;$ $d2 = 1/n2 \times 1.0a \times \lambda/4;$ $d3 = 1/n3 \times 7.0a \times \lambda/4;$ and $d4 = 1/n4 \times 5.0a \times \lambda/4,$ wherein a is a predetermined constant.

12. The method of manufacturing the organic electro-luminescence (EL) element according to claim 11, wherein the predetermined wavelength is within approximately five percent from a wavelength of one of a G-line, a H-line, and an I-line.

13. The method of manufacturing the organic electro-luminescence (EL) element according to claim 11, wherein the photosensitive resin layer absorbs the incident light of the predetermined wavelength and one of cures and becomes soluble in a predetermined solvent when the portion of the photosensitive resin layer is removed.

14. A method of manufacturing an organic electro-luminescence (EL) element, comprising:
    stacking, on a substrate, a light reflective layer, a first transparent electrode layer having a thickness of d1 and a refractive index of n1, a hole transport layer having a thickness of d2 and a refractive index of n2, and a photosensitive resin layer having a thickness of d4 and a refractive index of n4;
    removing a portion of the photosensitive resin layer by irradiating the photosensitive resin layer with light of a predetermined wavelength;
    providing a luminous function layer in a recess formed when the portion of the photosensitive resin layer is removed; and
    providing a second transparent electrode layer above the luminous function layer,
    wherein the light reflective layer, the first transparent electrode layer, and the hole transport layer are stacked above the substrate in a region isolated by the photosensitive resin layer,
    the photosensitive resin layer comprises a material that absorbs incident light of the predetermined wavelength when the portion of the photosensitive resin layer is removed,
    the first transparent electrode layer, the hole transport layer, and the photosensitive resin layer are an optical multi-layer film, each having a reflectance value that is between a local minimum value and a neighborhood value of the local minimum value, the reflectance value being a ratio of reflection of the incident light that is reflected from the light reflective layer toward the photosensitive resin layer to the incident light that is directed from the photosensitive resin layer toward the light reflective layer, and
    the predetermined wavelength is λ and satisfies:

$d1 = 1/n1 \times 1.8a \times \lambda/4;$ $d2 = 1/n2 \times 0.8a \times \lambda/4;$ and $d4 = 1/n4 \times 0.2a \times \lambda/4,$ wherein a is a predetermined constant.

15. The method of manufacturing the organic electro-luminescence (EL) element according to claim 14, wherein the predetermined wavelength is within approximately five percent from a wavelength of one of a G-line, a H-line, and an I-line.

16. The method of manufacturing the organic electro-luminescence (EL) element according to claim 14, wherein the photosensitive resin layer absorbs the incident light of the predetermined wavelength and one of cures and becomes soluble in a predetermined solvent when the portion of the photosensitive resin layer is removed.

* * * * *